(12) United States Patent
Chen et al.

(10) Patent No.: US 12,113,045 B2
(45) Date of Patent: Oct. 8, 2024

(54) THREE-DIMENSIONAL STACKED FAN-OUT PACKAGING STRUCTURE AND METHOD MAKING THE SAME

(71) Applicant: SJ Semiconductor(Jiangyin) Corporation, Jiangyin (CN)

(72) Inventors: Yenheng Chen, Jiangyin (CN); Chengchung Lin, Jiangyin (CN)

(73) Assignee: SJ Semiconductor(Jiangyin) Corporation, Jiangyin (CN)

( * ) Notice: Subject to any disclaimer, the term of this patent is extended or adjusted under 35 U.S.C. 154(b) by 249 days.

(21) Appl. No.: 17/574,106

(22) Filed: Jan. 12, 2022

(65) Prior Publication Data
US 2022/0271003 A1    Aug. 25, 2022

(30) Foreign Application Priority Data

Feb. 20, 2021  (CN) .......................... 202110193795.2
Feb. 20, 2021  (CN) .......................... 202120383190.5

(51) Int. Cl.
H01L 23/00    (2006.01)
(52) U.S. Cl.
CPC .............. *H01L 24/83* (2013.01); *H01L 24/44* (2013.01); *H01L 2224/45139* (2013.01); *H01L 2224/45144* (2013.01); *H01L 2224/45147* (2013.01); *H01L 2224/83191* (2013.01)
(58) Field of Classification Search
CPC ......... H01L 24/92; H01L 24/73; H01L 24/83; H01L 24/32; H01L 24/19; H01L 24/20; H01L 24/81; H01L 24/13; H01L 24/27; H01L 24/29; H01L 24/16; H01L 21/6835; H01L 25/105; H01L 2224/214; H01L 2224/95; H01L 2224/73267; H01L 2224/83104; H01L 2224/27416; H01L 2224/45139; H01L 2224/45144; H01L 2224/29299; H01L 2224/83102; H01L 2224/73204; H01L 2224/92244; H01L 2224/131; H01L 2224/32; H01L 2224/58; H01L 2224/32105; H01L 2224/83005; H01L 2224/83191
USPC ......................................................... 257/783
See application file for complete search history.

(56) References Cited

U.S. PATENT DOCUMENTS

2019/0333879 A1\* 10/2019 Chen .................... H01Q 21/065

\* cited by examiner

*Primary Examiner* — Jasmine J Clark
(74) *Attorney, Agent, or Firm* — IPRTOP LLC

(57) ABSTRACT

The present disclosure provides a three-dimensional stacked fan-out packaging structure and a method making the same. The structure includes: a first semiconductor chip, a first packaging material layer, a metal connecting pillar, a first rewiring layer, a second rewiring layer, a second semiconductor chip, solder ball bumps, an underfill layer under the second semiconductor chip, and a second packaging material layer. The formed three-dimensional stacked fan-out packaging structure can package two sets of fan-out wafers in the three-dimensional direction. A single package stacked up after die-cutting has two sets of chips in the third-direction. The electrical signals of all chips in a single package can be controlled by arranging a first rewiring layer, a metal connecting post, and the second rewiring layer, so that more chips can be packaged in a single package, the integration of the package is improved, and the package volume can shrink.

18 Claims, 8 Drawing Sheets

THREE-DIMENSIONAL STACKED FAN-OUT PACKAGING STRUCTURE AND METHOD MAKING THE SAME

CROSS REFERENCE TO RELATED APPLICATION

The present application claims the benefit of priority to Chinese Patent Application No. CN2021101937952, entitled "Three-Dimensional Stacked Fan-Out Packaging Structure and Method Making the Same", filed with CNIPA on Feb. 20, 2021, and Chinese Patent Application No. 2021203831905, entitled "Three-Dimensional Stacked Fan-Out Packaging Structure", filed with CNIPA also on Feb. 20, 2021, the content of which is incorporated herein by reference in their entireties.

FIELD OF TECHNOLOGY

The present disclosure relates to the technical field of chip packaging, in particular, to a three-dimensional stacked fan-out packaging structure and a method making the same.

BACKGROUND

Integrated circuit (IC) packaging field has struggled to meet requirements for making lower cost, more reliable, faster, and higher density circuits. IC packaging will continue to shrink the minimum feature sizes in the future to increase the integration density of various electronic components. Currently, advanced packaging methods include: Wafer Level Chip Scale Packaging (WLCSP), Fan-Out Wafer Level Package (FOWLP), Flip Chip, Package-on-Package (POP), etc.

Fan-out wafer-level packaging is a wafer-level processing embedded chip packaging method. It is currently one of the advanced packaging methods with more input/output (I/O) ports and better integration flexibility. Fan-out wafer-level packaging has its unique advantages compared to conventional wafer-level packaging: 1) The I/O pitch is flexible and does not depend on the chip size. 2) Only an effective die is used, and the product yield is improved. 3) Fan-out wafer-level packaging has a flexible 3D packaging path, that is, an arbitrary array of graphics can be formed on the top. 4) Fan-out wafer-level packaging has good electrical and thermal properties. 5) Fan-out wafer-level packaging is applied in high frequency industry. 6) It is easy for fan-out wafer-level packaging to realize high-density wiring in the rewiring layer (RDL).

At present, fan-out wafer-level packaging is mostly done with single-layer packaging, that is, a layer of fan-out chip is packaged on a substrate. The current conventional process includes: providing a substrate and disposing an adhesive layer on a surface of the substrate; placing a chip face up on a surface of an adhesive layer; coating a dielectric layer; performing lithography patterning and electroplating to form a rewiring layer (RDL); packaging the chip in a packaging material layer by an injection molding process; grinding and opening; performing lithography patterning and electroplating to form an under bump metal (UBM) layer; ball-planting and reflowing to form an array of solder balls; and removing the substrate. The wafer package formed by this packaging method contains only one chip in a single chip package formed after die cutting. Given the current desire for higher-density circuits, the circuit interconnection among multiple chips requires re-packaging already packaged chips multiple times, which results in low integration level and large package volumes, thus affecting the performance of a single chip.

SUMMARY

Some embodiments of the present disclosure provide a three-dimensional stacked fan-out packaging structure and a method making the same, to solve the problems of the conventional fan-out wafer-level package, such as low integration, large package volume, and affecting the performance of a single chip.

The present disclosure provides a three-dimensional stacked fan-out packaging structure. The structure includes a first semiconductor chip, a first packaging material layer, a metal connecting pillar, a first rewiring layer, a second rewiring layer, a second semiconductor chip, a solder ball bump, an underfill layer, and a second packaging material layer.

The first packaging material layer includes a first surface and a second surface opposite to the first surface, and the first packaging material layer is disposed in a periphery area of the first semiconductor chip.

The metal connecting pillar is disposed penetrating through the first packaging material layer.

The first rewiring layer is disposed on the first surface of the first packaging material layer, and electrically connected to the first semiconductor chip and the metal connecting pillar.

The second rewiring layer is disposed on the second surface of the first packaging material, and electrically connected to the metal connecting pillar. The second rewiring layer electrically connects to the first rewiring layer through the metal connecting pillar. The first semiconductor chip is bonded to the second rewiring layer.

The second semiconductor chip is disposed on a surface of the second rewiring layer away from the first semiconductor chip, and electrically connected to the second rewiring layer.

The solder ball bump is disposed on a surface of the first rewiring layer away from the first semiconductor chip, and electrically connected to the first rewiring layer.

The underfill layer is disposed between the second semiconductor chip and the second rewiring layer.

The second packaging material layer packages the second semiconductor chip in a periphery area of the second semiconductor chip.

In some embodiments, the first semiconductor chip is a first bare chip or a first packaged chip, and the second semiconductor chip is a second bare chip or a second packaged chip.

In some embodiments, the first bare chip includes a contact pad, a dielectric layer formed on the contact pad, and a metal pillar formed in the dielectric layer and penetrating the dielectric layer. One end of the metal pillar is connected to the contact pad, and another end of the metal pillar is connected to the first rewiring layer.

In some embodiments, the first packaged chip includes a contact pad. A solder connection structure is formed on the first packaged chip, and the solder connection structure includes a metal pillar and a solder ball. One end of the metal pillar is connected to the contact pad, another end of the metal pillar is connected to the solder ball, and the solder ball is connected to the first rewiring layer.

In some embodiments, the second bare chip includes a contact pad, a dielectric layer formed on the contact pad, and a metal pillar formed in the dielectric layer and penetrating the dielectric layer. One end of the metal pillar is connected to the contact pad, and another end of the metal pillar is connected to the second rewiring layer.

In some embodiments, the second packaged chip includes a contact pad. A solder connection structure is formed on the second packaged chip, and the solder connection structure includes a metal pillar and a solder ball. One end of the metal pillar is connected to the contact pad, another end of the metal pillar is connected to the solder ball, and the solder ball is connected to the second rewiring layer.

In some embodiments, the first rewiring layer includes a first wiring dielectric layer and a first metal wiring layer disposed in the first wiring dielectric layer. The second rewiring layer includes a second wiring dielectric layer and a second metal wiring layer disposed in the second wiring dielectric layer; a material of the first wiring dielectric layer and a material of the second wiring dielectric layer each includes one or more of epoxy resin, silicone rubber, polyimide (PI), polybenzoxazole (PBO), benzocyclobutene (BCB), silicon oxide, phosphorosilicate glass, and fluorine-containing glass; and a material of the first metal wiring layer and a material of the second metal wiring layer each includes one or more of copper, aluminum, nickel, gold, silver, and titanium.

In some embodiments, the first packaging material layer includes one or more of a polyimide layer, a silicone rubber layer, and an epoxy resin layer; the second packaging material layer includes one or more of a polyimide layer, a silicone rubber layer, and an epoxy resin layer, and the underfill layer includes an epoxy resin layer.

In some embodiments, a material of the solder ball bump includes one or more of copper, aluminum, nickel, gold, silver, and titanium.

The present disclosure further provides a method for making a three-dimensional stacked fan-out packaging structure. The method includes: providing a first supporting substrate; disposing a separation layer on the first supporting substrate; forming a second rewiring layer on the separation layer; forming a metal connection pillar on the second rewiring layer, the metal connection pillar is electrically connected to the second rewiring layer; providing a first semiconductor chip and bonding the first semiconductor chip to the second rewiring layer; forming a first packaging material layer on a surface of the second rewiring layer, the first packaging material layer fills a gap between the first semiconductor chip and the metal connecting pillar and packages the first semiconductor chip and the metal connecting pillar, the first packaging material layer includes a first surface and a second surface opposite to the first surface, the second surface of the first packaging material layer is in contact with the second rewiring layer, and the first surface of the first packaging material layer exposes the metal connecting pillar; forming a first rewiring layer on the first surface of the first packaging material layer, the first rewiring layer is electrically connected to the first semiconductor chip and the metal connecting pillar; forming a solder bump on a surface of the first rewiring layer away from the first semiconductor chip, the solder bump is electrically connected to the first rewiring layer; providing a second supporting substrate and bonding the second supporting substrate to the first rewiring layer; removing the first supporting substrate and the separation layer to expose the second rewiring layer; providing a second semiconductor chip and electrically connecting the second semiconductor chip to the second rewiring layer; forming an underfill layer between the second semiconductor chip and the second rewiring layer; forming a second packaging material layer on a periphery area of the second semiconductor chip; and removing the second supporting substrate.

In some embodiments, the first supporting substrate includes one of a glass substrate, a metal substrate, a semiconductor substrate, a polymer substrate, and a ceramic substrate; the second supporting substrate includes one of a glass substrate, a metal substrate, a semiconductor substrate, a polymer substrate, and a ceramic substrate; and the separation layer is a polymer layer or an adhesive layer, the separation layer is coated on the surface of the first supporting substrate by a spin coating process, then cured and molded by an ultraviolet curing or thermal curing process.

In some embodiments, the first rewiring layer includes a first wiring dielectric layer and a first metal wiring layer disposed in the first wiring dielectric layer, and the second rewiring layer includes a second wiring dielectric layer and a second metal wiring layer disposed in the second wiring dielectric layer; a material of the first wiring dielectric layer and a material of the second wiring dielectric layer each includes one or more of epoxy resin, silicone rubber, polyimide (PI), polybenzoxazole (PBO), benzocyclobutene (BCB), silicon oxide, phosphorosilicate glass, and fluorine-containing glass, and a material of the first metal wiring layer and a material of the second metal wiring layer includes one or more of copper, aluminum, nickel, gold, silver, and titanium.

In some embodiments, the forming of the first rewiring layer and the second rewiring layer includes: forming a dielectric layer using a chemical vapor deposition process or a physical vapor deposition process, and etching the dielectric layer to form the wiring dielectric layer, and forming a metal layer on a surface of the wiring dielectric layer using a chemical vapor deposition process, a physical vapor deposition process, a sputtering process, an electroplating process, or an electroless plating process, and etching the metal layer to form a metal wiring layer, the metal connection pillar is electrically connected to the metal wiring layer.

In some embodiments, the first semiconductor chip is a first bare chip or a first packaged chip, and the second semiconductor chip is a second bare chip or a second packaged chip.

In some embodiments, the first bare chip includes a contact pad, a dielectric layer formed on the contact pad, and a metal pillar formed in the dielectric layer and penetrating the dielectric layer. One end of the metal pillar is connected to the contact pad, and another end of the metal pillar is connected to the first rewiring layer.

In some embodiments, the first packaged chip includes a contact pad. A solder connection structure is formed on the first packaged chip, and the solder connection structure includes a metal pillar and a solder ball. One end of the metal pillar is connected to the contact pad, another end of the metal pillar is connected to the solder ball, and the solder ball is connected to the first rewiring layer.

In some embodiments, the second bare chip includes a contact pad, a dielectric layer formed on the contact pad, and a metal pillar formed in the dielectric layer and penetrating the dielectric layer. One end of the metal pillar is connected to the contact pad, and another end of the metal pillar is connected to the second rewiring layer.

In some embodiments, the second packaged chip includes a contact pad, a solder connection structure is formed on the second packaged chip, and the solder connection structure includes a metal pillar and a solder ball. One end of the metal pillar is connected to the contact pad, another end of the metal pillar is connected to the solder ball, and the solder ball is connected to the second rewiring layer.

As mentioned above, the present disclosure provides a three-dimensional stacked fan-out packaging structure and a method making the same. The formed three-dimensional stacked fan-out packaging structure can package two layers of fan-out wafers in the three-dimensional direction (i.e., the thickness direction). A single package formed after die cutting has two layers of chips in the three-dimensional direction. The electrical signals of all chips in a single package can be controlled by arranging a first rewiring layer, a metal connecting post, and the second rewiring layer, so that more chips can be packaged in a single package, the integration of the fan-out wafer level package is improved, and the package volume can shrink. Furthermore, packaging multiple chips in the same package can effectively improve the performance of a single chip. Finally, the method also makes it possible to package more than three layers of fan-out wafer in a single package.

DESCRIPTION OF REFERENCE NUMERALS

Figure 1:
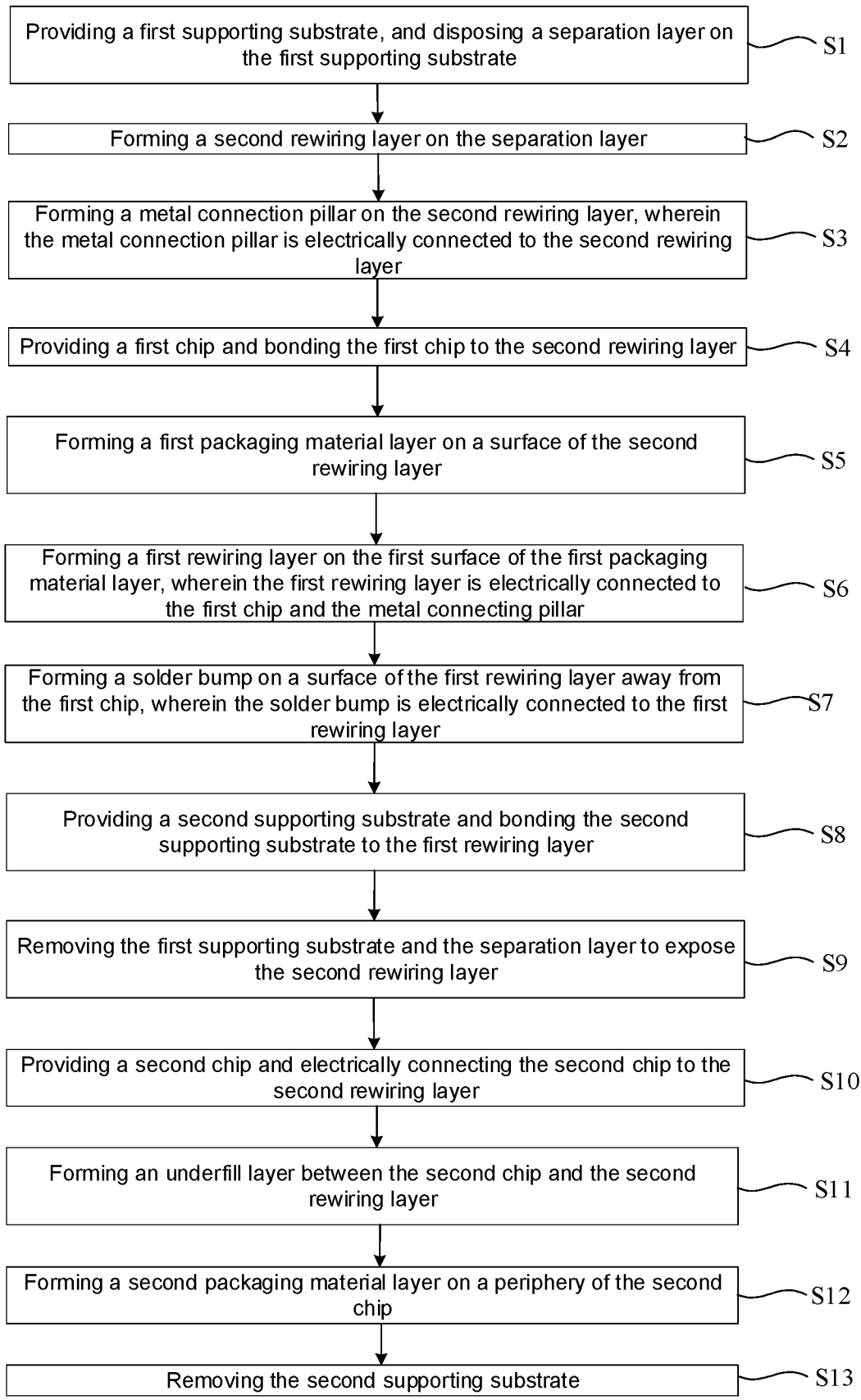
FIG. 1 shows a schematic flowchart of a method for making a three-dimensional stacked fan-out packaging structure according to Embodiment 1 of the present disclosure.

10 First supporting substrate
11, 23 Separation layer
12 Second rewiring layer
121, 161 Wiring dielectric layer
122, 162 Metal wiring layer
123 Etched window
13 Metal connecting pillar
14 First semiconductor chip
141, 191 Contact pad
142 Dielectric layer
143, 192 Metal pillar
15 First packaging material layer
16 First rewiring layer
17 Solder ball bump
18 Second supporting substrate
19 Second semiconductor chip
193 Solder ball
20 Underfill layer
21 Second packaging material layer
22 Adhesive layer
S1~S13 Steps of method making the packaging device

DETAILED DESCRIPTION

The embodiments of the present disclosure will be described below through exemplary embodiments. Those skilled in the art can easily understand other advantages and effects of the present disclosure according to contents disclosed by the specification. The present disclosure can also be implemented or applied through other different exemplary embodiments. Various modifications or changes can also be made to all details in the specification based on different points of view and applications without departing from the spirit of the present disclosure.

Please refer to FIGS. 1-17. It needs to be stated that the drawings provided in the following embodiments are just used for schematically describing the basic concept of the present disclosure, thus only illustrating components related to the present disclosure and are not drawn according to the numbers, shapes and sizes of the components during actual implementation. The configuration, number and scale of each component during actual implementation thereof may be changed according to actual needs, and the component layout configuration thereof may be more complicated.

Embodiment 1

As shown in FIG. 1, this embodiment provides a method for making a three-dimensional stacked fan-out packaging structure. The three-dimensional stacked fan-out packaging structure formed by the method can package two layers of fan-out wafers in the third-dimensional direction (i.e., the thickness direction). A single package formed after die cutting has two layers of chips in the third-dimensional direction. The electrical signals of all chips in a single package can be controlled by arranging the first rewiring layer, the metal connecting post, and the second rewiring layer, so that more chips can be packaged in a single package, the integration level of the fan-out wafer level package is improved, and the package volume can shrink. Furthermore, packaging multiple chips in the same package can effectively improve the performance of the single chip. Finally, the method also makes it possible to package more than three layers of fan-out wafers in one single package.

Specifically, FIGS. 2-17 illustrate schematic views of the three-dimensional stacked fan-out packaging structure after each step of the method for making it, according to this embodiment. For ease of understanding, the figures show only one chip per layer of wafer during the presentation of the structures in each step, but those skilled in the art can understand that the number of chips per layer of fan-out wafer is not one, generally several, that is, more than two.

Figure 2:
FIGS. 2-17 show schematic views of the structures after each step of the method for making the three-dimensional stacked fan-out packaging structure according to Embodiment 1 of the present disclosure, wherein FIG. 17 also shows a schematic view of the three-dimensional stacked fan-out packaging structure according to Embodiment 2 of the present disclosure.
Figure 3:

As shown in FIGS. 1-3, step S1 is first performed, a first supporting substrate 10 (as shown in FIG. 2) is provided, and a separation layer 11 is disposed on the first supporting substrate 10 (as shown in FIG. 3).

As shown in FIG. 2, as an example, the first supporting substrate 10 includes one of a glass substrate, a metal substrate, a semiconductor substrate, a polymer substrate, and a ceramic substrate. In this embodiment, the first supporting substrate 10 is a glass substrate, which has a low cost, is easy to dispose a separation layer 11 on its surface, and can reduce the difficulty of the subsequent peeling process. The shape of the first supporting substrate 10 may be round, square or any other desired shapes. In this embodiment, the first supporting substrate 10 is used to prevent the chip from cracking, warping, breaking, etc., during subsequent manufacturing processes.

As shown in FIGS. 3-11, the separation layer 11 keeps a second rewiring layer 12 subsequently formed and other structures on the second rewiring layer 12 away from the first supporting substrate 10. The separation layer 11 is preferably made of an adhesive material with a smooth surface. The separation layer 11 has a certain bonding force with the second rewiring layer 12 to ensure that the second rewiring layer 12 will not move in subsequent processes. In addition, the separation layer 11 has a strong bonding force with the first supporting substrate 10. Generally speaking, the bonding force between the separation layer 11 and the first supporting substrate 10 is greater than the bonding force between the separation layer 11 and the second rewiring layer 12. As an example, the separation layer 11 is a polymer layer or an adhesive layer. The polymer layer or adhesive layer is first coated on the surface of the first supporting substrate 10 by a spin coating process, and then cured and molded by an ultraviolet curing or thermal curing process.

In this embodiment, the polymer layer includes a light-to-heat conversion (LTHC) layer. When the first supporting substrate 10 is peeled off subsequently, the LTHC layer may be heated by a laser when separating the second rewiring layer 12 from the first supporting substrate 10.

Figure 4:
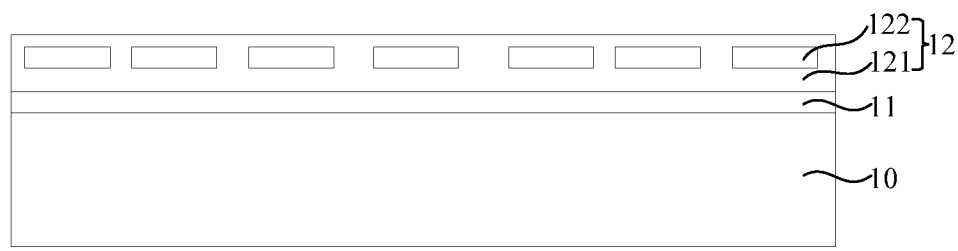

As shown in FIGS. 1 and 4, step S2 is performed, a second rewiring layer 12 is formed on the separation layer 11.

As shown in FIG. 4, as an example, the second rewiring layer 12 includes a wiring dielectric layer 121 and a metal wiring layer 122 disposed in the wiring dielectric layer 121. The material of the wiring dielectric layer 121 includes one or more of epoxy resin, silicone rubber, polyimide (PI), polybenzoxazole (PBO), benzocyclobutene (BCB), silicon oxide, phosphorosilicate glass, and fluorine-containing glass. The material of the metal wiring layer 122 includes one or more of copper, aluminum, nickel, gold, silver, and titanium.

As an example, forming the second rewiring layer 12 includes the following steps: first, disposing a dielectric layer on the surface of the separation layer 11 by a chemical vapor deposition process or a physical vapor deposition process, and etching the dielectric layer to form a patterned wiring dielectric layer 121; then forming a metal layer on the surface of the wiring dielectric layer 121 by a chemical vapor deposition process, a physical vapor deposition process, a sputtering process, an electroplating process, or an electroless plating process, and the metal layer is etched back to form a metal wiring layer 122, which is then disposed on by a dielectric layer of the same material as that of the dielectric layer 121. It should be noted that the materials, number of layers, and distribution of the wiring dielectric layer 121 and the metal wiring layer 122 may be set according to the specific conditions of the chips, which are not limited here.

Figure 5:
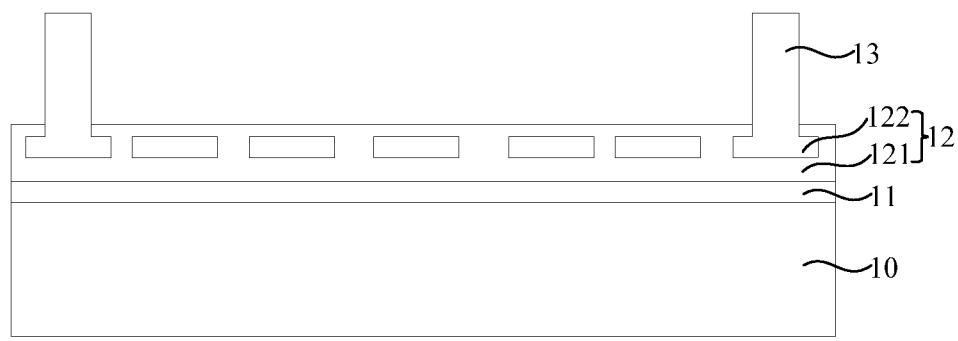

As shown in FIGS. 1 and 5, step S3 is performed, in this step, a metal connection pillar 13 is formed on the second rewiring layer 12, and the metal connection pillar 13 is electrically connected to the second rewiring layer 12.

As shown in FIG. 5, as an example, when the second rewiring layer 12 includes the wiring dielectric layer 121 and the metal wiring layer 122 disposed in the wiring dielectric layer 121, the metal connecting pillar 13 contacts with the metal wiring layer 122 through a standard patterning process which is not described here, thereby achieving electrical connection between the metal connecting pillar 13 and the second rewiring layer 12.

As an example, the material of the metal connecting pillar 13 includes one or more of gold wire, silver wire, copper wire, and aluminum wire. The metal connecting pillar 13 may also include one or more of gold pillar, silver pillar, copper pillar, and aluminum pillar. The method of forming the metal connecting pillar 13 includes one or more of wire bonding, electroplating, and electroless plating.

Specifically, the metal connecting pillar 13 may be a copper wire, and formed by a wire bonding process, such as one or more of a hot-pressed wire bonding process, an ultrasonic wire bonding process, and a hot-pressed ultrasonic wire bonding process. The type and forming method of the metal connecting column 13 may also be selected according to needs, and there is no limitation here.

Figure 6:
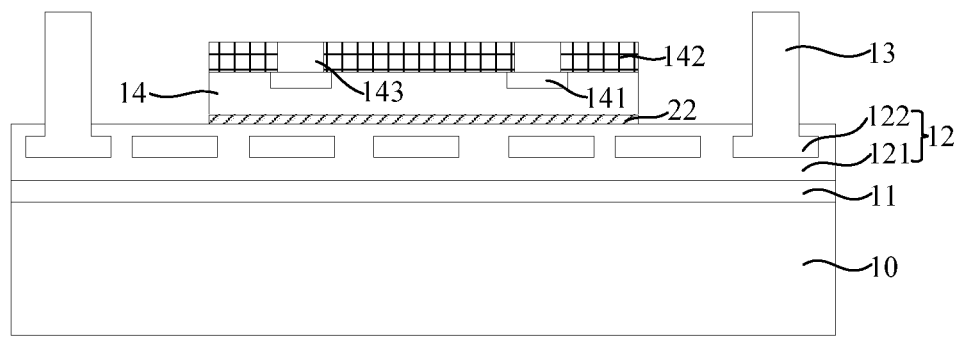

As shown in FIGS. 1 and 6, step S4 is performed, a first semiconductor chip 14 is provided and bonded with the second rewiring layer 12.

As an example, the form of the first semiconductor chip 14 is not limited, that is, the first semiconductor chip 14 may be an unpackaged bare chip or a packaged chip, and in this layer of fan-out wafer, the form of the first semiconductor chip 14 may be the same or different, and it may be set according to actual needs. As shown in FIG. 6, the first semiconductor chip 14 is a bare chip, the bare chip includes a contact pad 141, a dielectric layer 142 is formed on the bare chip, and a metal pillar 143 is formed in the dielectric layer 142 and penetrates the dielectric layer 142. One end of the metal pillar 143 is connected to the contact pad 141, and the other end of the metal pillar 143 is connected to a first rewiring layer 16 to be formed later.

As shown in FIG. 6, as an example, the first semiconductor chip 14 may be bonded to the second rewiring layer 12 through an adhesive layer 22 to ensure that the first semiconductor chip 14 will not move in subsequent processes and during use. The material of the adhesive layer 22 may be a double-sided adhesive tape or an adhesive glue made by a spin coating process, but it is not limited to this, as long as the adhesive layer 22 has the required adhesive performance.

Figure 7:
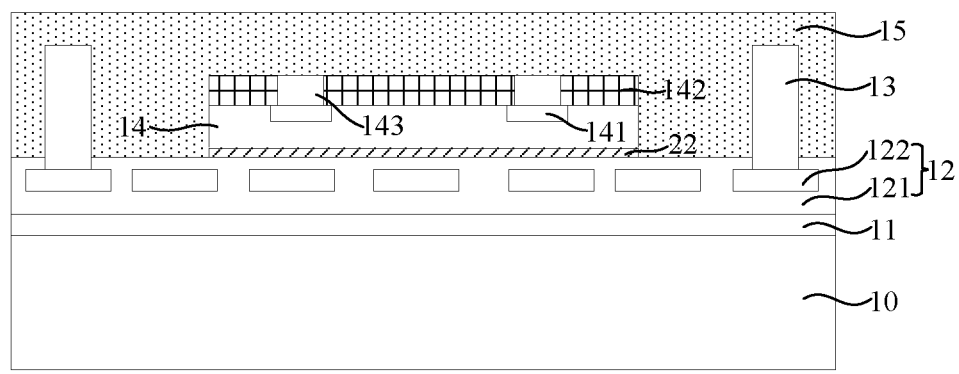
Figure 8:
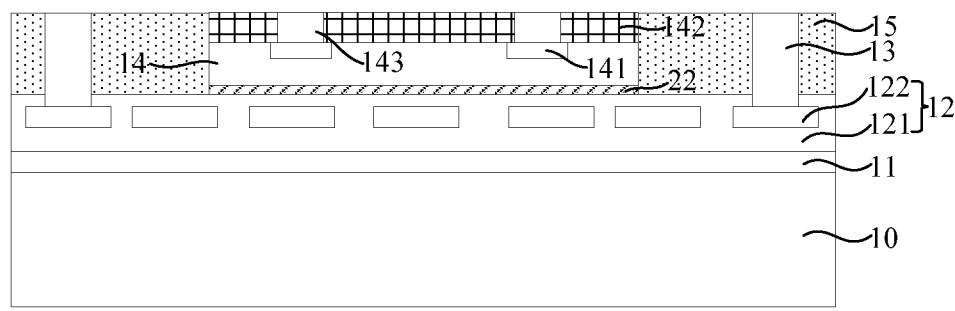

As shown in FIGS. 1, 7, and 8, step S5 is performed, a first packaging material layer 15 is formed on the surface of the second rewiring layer 12, and the first packaging material layer 15 fills the gap between the first semiconductor chip 14 and the metal connecting pillar 13 and packages the first semiconductor chip 14 and the metal connecting pillar 13. The first packaging material layer 15 includes a first surface and a second surface opposite to the first surface. The second surface of the first packaging material layer 15 is in contact with the second rewiring layer 12, and the first surface of the first packaging material layer 15 exposes the metal connecting pillar 13.

As an example, the first packaging material layer 15 includes one or more of a polyimide layer, a silicone rubber layer, and an epoxy resin layer. A method of forming the first packaging material layer 15 includes one of more of compression molding, transfer molding, liquid sealing molding, vacuum lamination, and spin coating.

Specifically, a layer of first packaging material layer 15 is formed on the surface of the second rewiring layer 12 (as shown in FIG. 7), and then the top surface of the first packaging material layer 15 is polished or planarized to form a flat first packaging material layer 15 (as shown in FIG. 8), which improves product surface quality.

In another example, the first packaging material layer 15 may also be formed align with the height of the metal connecting pillar 13, so that the height of the first packaging material layer 15 is the same as the height of the metal connecting pillar 13. That is, the first surface of the first packaging material layer 15 is flush with the surface of the metal connecting pillar 13. In this way, the step of planarizing the first packaging material layer 15 can be omitted, thereby simplifying the process.

Figure 9:
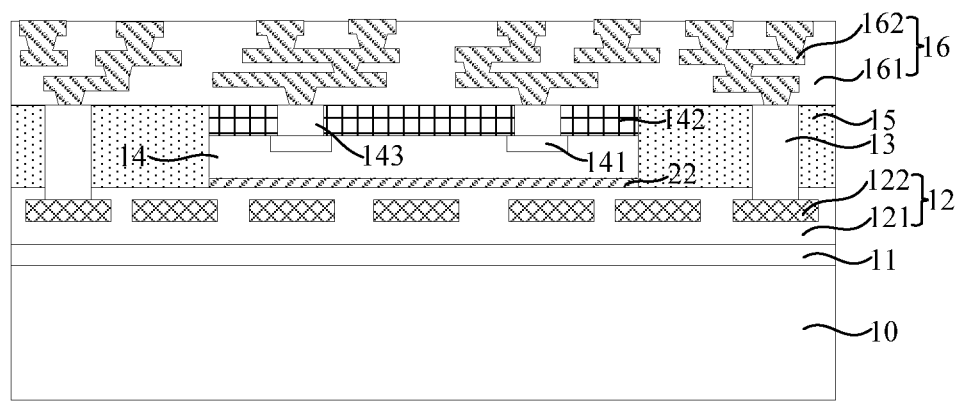

As shown in FIGS. 1 and 9, step S6 is performed, a first rewiring layer 16 is formed on the first surface of the first packaging material layer 15, and the first rewiring layer 16 is electrically connected to the first semiconductor chip 14 and the metal connecting pillar 13. After this step, the electrical signal of the first semiconductor chip 14 is controlled by the first rewiring layer 16, and the electrical signal of the second semiconductor chip 19 formed later is controlled by the first rewiring layer 16 through the second rewiring layer 12 and the metal connecting pillar 13, that is, both the first semiconductor chip 14 and the second semiconductor chip 19 formed later are controlled by the first rewiring layer 16.

As shown in FIG. 9, as an example, the first rewiring layer 16 includes a wiring dielectric layer 161 and a metal wiring layer 162 located in the wiring dielectric layer 161. The material of the wiring dielectric layer 161 includes one or more of epoxy resin, silicone rubber, polyimide (PI), polybenzoxazole (PBO), benzocyclobutene (BCB), silicon oxide, phosphorosilicate glass, and fluorine-containing glass. The material of the metal wiring layer 162 includes one or more of copper, aluminum, nickel, gold, silver, and titanium.

As an example, forming the first rewiring layer 16 includes the following steps: first, a dielectric layer is formed on the surface of the first packaging material layer 15 by a chemical vapor deposition process or a physical vapor deposition process, and the dielectric layer is etched to form the wiring dielectric layer 161; then a metal layer is formed on the surface of the wiring dielectric layer 161 by a chemical vapor deposition process, a physical vapor deposition process, a sputtering process, an electroplating process, or an electroless plating process, and the metal layer is etched to form a metal wiring layer 162. It should be noted that the materials, number of layers, and distribution of the wiring dielectric layer 161 and the metal wiring layer 162 may be set according to the specific conditions of the chip, which is not limited here.

Figure 10:
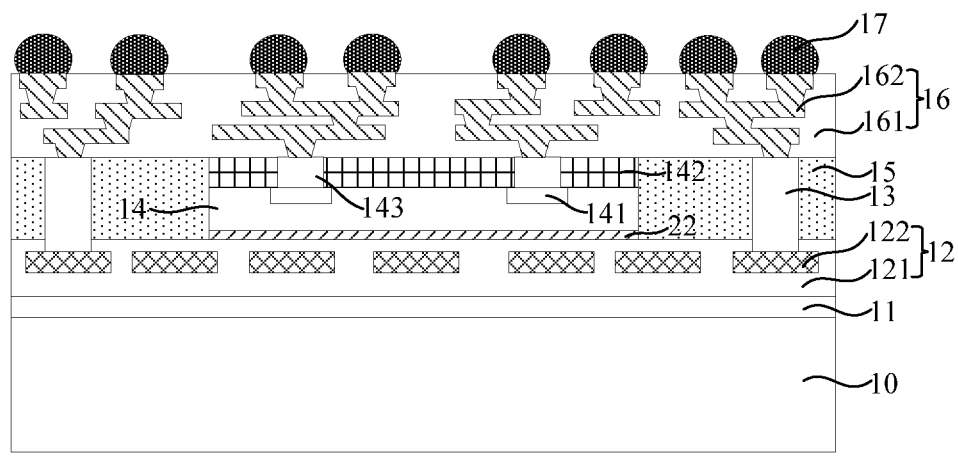

As shown in FIGS. 1 and 10, step S7 is performed, solder bumps 17 are formed on the surface of the first rewiring layer 16 away from the first semiconductor chip 14, and the solder bumps 17 are electrically connected to the first rewiring layer 16.

As an example, the material of the solder ball bumps 17 includes one or more of copper, aluminum, nickel, gold, silver, and titanium, and the solder ball bumps 17 may be formed by a ball-planting and reflowing process.

Figure 11:
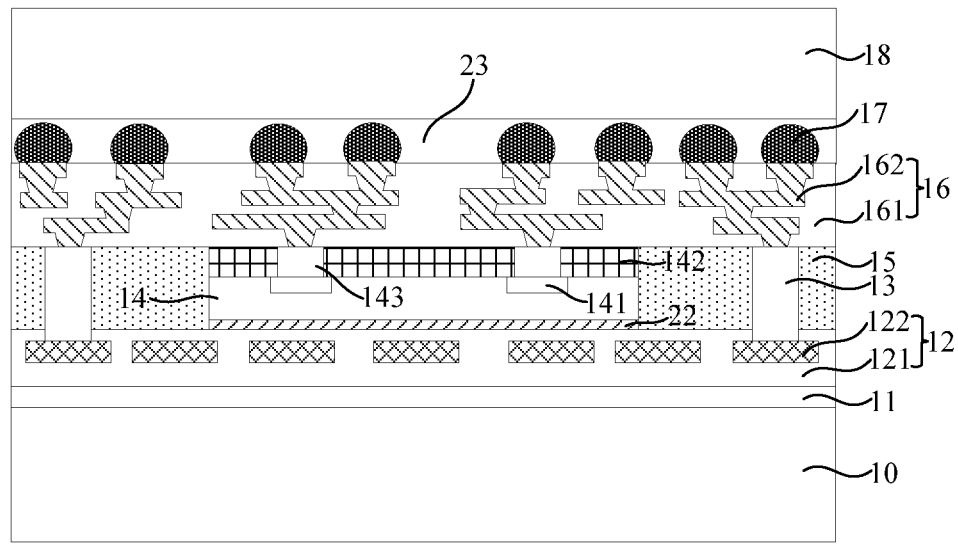

As shown in FIGS. 1 and 11, step S8 is performed, a second supporting substrate 18 is provided and bonded to the first rewiring layer 16.

As shown in FIG. 11, as an example, the second supporting substrate 18 includes one of a glass substrate, a metal substrate, a semiconductor substrate, a polymer substrate, and a ceramic substrate. In this embodiment, the second supporting substrate 18 is a glass substrate. The glass substrate has a low cost, is easy to dispose a separation layer 23 on its surface, and can reduce the difficulty of the subsequent peeling process. The shape of the second supporting substrate 18 may be round, square or any other desired shapes. In this embodiment, the second supporting substrate 18 is used to prevent the chip from cracking, warping, breaking, etc. during subsequent manufacturing processes.

As shown in FIG. 11, as an example, a separation layer 23 may be disposed between the second supporting substrate 18 and the first rewiring layer 16 to achieve adhesion between the two. As an example, the separation layer 23 includes a polymer layer or an adhesive layer.

Figure 12:
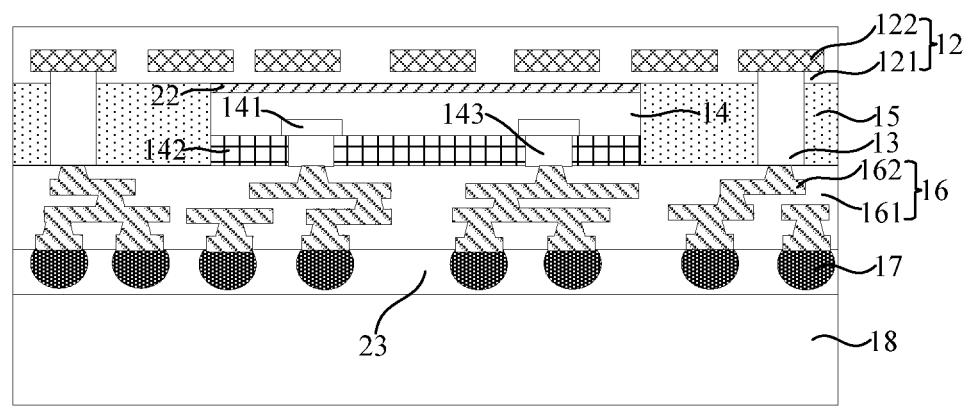

As shown in FIGS. 1 and 12, step S9 is performed, the first supporting substrate 10 and the separation layer 11 are removed to expose the second rewiring layer 12.

As an example, when the separation layer 11 includes an adhesive layer, an exposure method may be used to reduce the viscosity of the adhesive, to separate the separation layer 11 from the second rewiring layer 12. When the separation layer 11 includes an LTHC layer, the LTHC layer is heated using a laser to separate the second rewiring layer 12 from the first supporting substrate 10.

Figure 13:
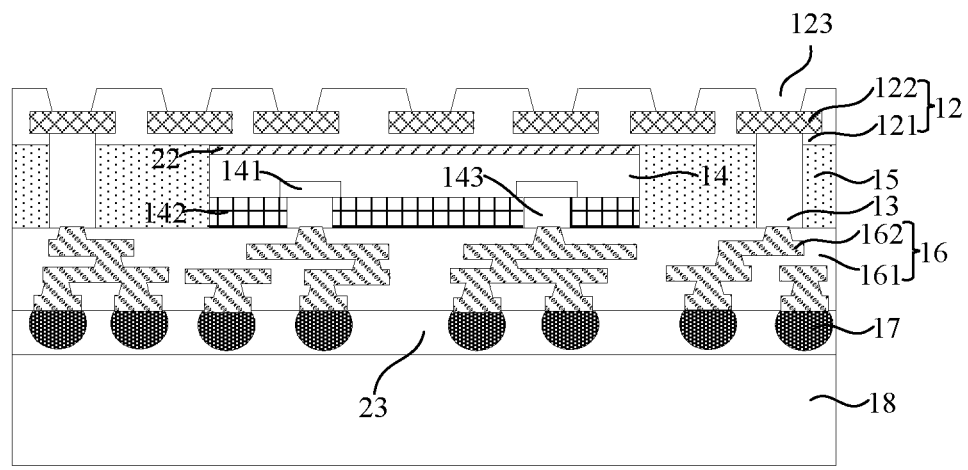
Figure 14:
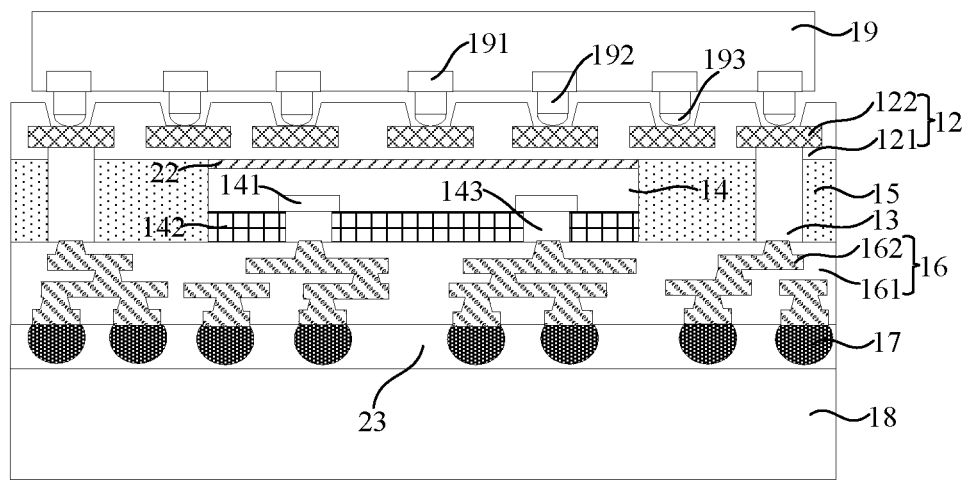

As shown in FIGS. 1, 13, and 14, step S10 is performed, a second semiconductor chip 19 is provided and electrically connected to the second rewiring layer 12. After this step, the second semiconductor chip 19 is electrically connected to the second rewiring layer 12, and the second rewiring layer 12 is electrically connected to the first rewiring layer 16 through the metal connecting pillar 13, thereby achieving electrical connection between the first rewiring layer 16 and the second rewiring layer 12.

As an example, the form of the second semiconductor chip 19 is not limited, that is, the second semiconductor chip 19 may be an unpackaged bare chip or a packaged chip. In this layer of fan-out wafer, the chip 19 may be of the same or different form, and it may be set according to actual needs. As shown in FIG. 14, the second semiconductor chip 19 is a packaged chip. The packaged chip includes contact pads 191. Solder connection structures are formed on the packaged chip. Each of the solder connection structures includes a metal pillar 192 and a solder ball 193. One end of the metal pillar 192 is connected to the contact pad 191, the other end is connected to the solder ball 193, and the solder ball 193 is connected to the second rewiring layer 12. As shown in FIG. 13, the wiring dielectric layer 121 in the second rewiring layer 12 is etched using laser etching, using such as an infrared laser, to form an etched window 123 that exposes the metal wiring layer 122. As shown in FIG. 14, the second semiconductor chip 19 is electrically connected to the second rewiring layer 12 through the solder balls 193.

Figure 15:
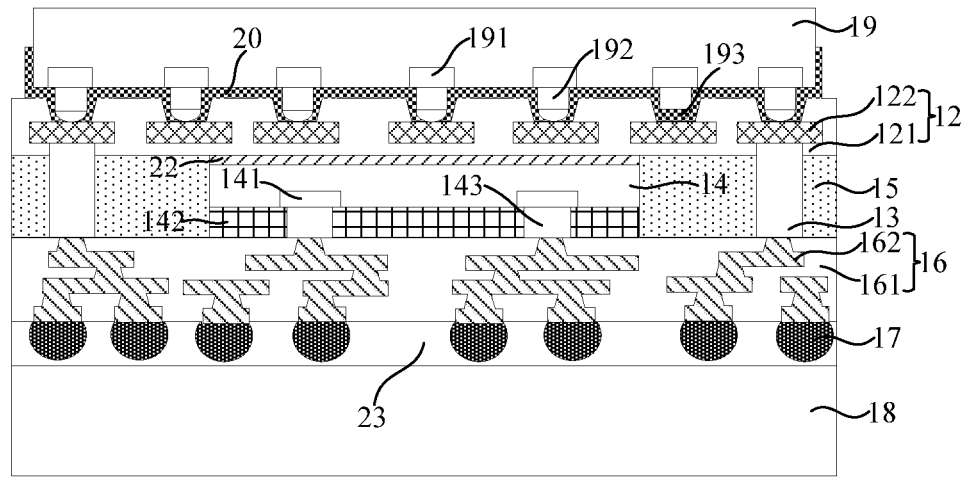

As shown in FIGS. 1 and 15, step S11 is performed, an underfill layer 20 is formed between the second semiconductor chip 19 and the second rewiring layer 12. The underfill layer 20 can improve the bonding strength between the second semiconductor chip 19 and the second rewiring layer 12 and protect the second rewiring layer 12. Based on this, the material particles of the underfill layer 20 are smaller than that of the packaging material layer, so the underfill layer 20 has better bonding strength and can effectively protect the second rewiring layer 12.

As an example, the underfill layer is an epoxy resin layer, but it may also be other filler materials with smaller particles. A method of forming the underfill layer 20 includes, but is not limited to, one or more of inkjet, dispensing, compression molding, transfer molding, liquid sealing, vacuum lamination, and spin coating.

Figure 16:
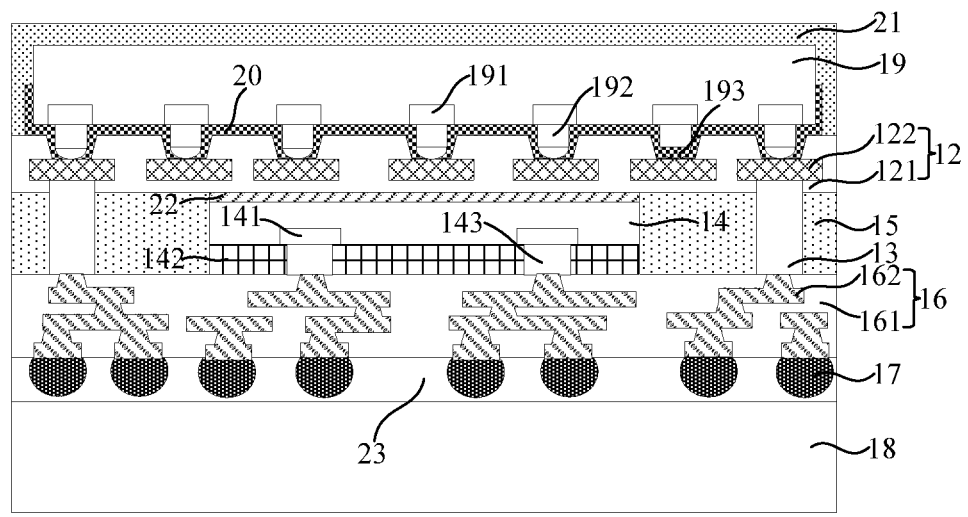

As shown in FIGS. 1 and 16, step S12 is performed, a second packaging material layer 21 is formed on the periphery of the second semiconductor chip 19. In this way, the second semiconductor chip 19 is protected by the second packaging layer 21 and the underfill layer 20 on the outer periphery, and in the meantime, the second rewiring layer 12 is protected, thereby effectively improving the packaging strength of the entire package, and improving the packaging quality.

As an example, the second packaging material layer 21 includes one or more of a polyimide layer, a silicone rubber layer, and an epoxy resin layer. A method of forming the second packaging material layer 21 includes one of more of compression molding, transfer molding, liquid sealing molding, vacuum lamination, and spin coating.

Figure 17:
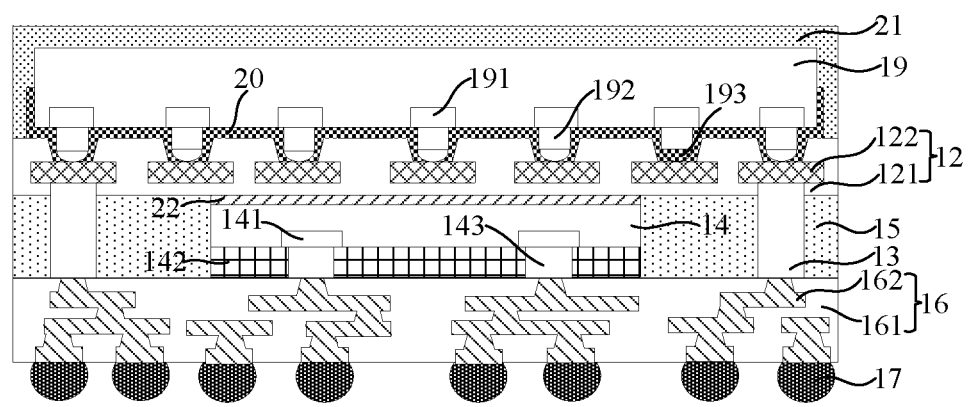

As shown in FIGS. 1 and 17, step S13 is performed, the second supporting substrate 18 is removed.

As an example, the second supporting substrate 18 and the first rewiring layer 16 are bonded through the separation layer 23. As an example, when the separation layer 23 includes an adhesive layer, an exposure method may be used to reduce the viscosity of the adhesive, to separate the separation layer 23 from the first rewiring layer 16. When the separation layer 23 includes an LTHC light-to-heat conversion layer, the LTHC light-to-heat conversion layer is heated using a laser to separate the first rewiring layer 16 from the second supporting substrate 18.

Embodiment 2

This embodiment provides a three-dimensional stacked fan-out packaging structure. The package structure can be made by the method of Embodiment 1 above, but is not limited to the method described in Embodiment 1, as long as the three-dimensional stacked fan-out packaging structure can be made. For the beneficial effects that can be achieved by the three-dimensional stacked fan-out packaging structure, please refer to Embodiment 1, which will not be described in detail below.

As shown in FIG. 17, the three-dimensional stacked fan-out packaging structure includes a first semiconductor chip 14, a first packaging material layer 15, a metal connecting pillar 13, a first rewiring layer 16, a second rewiring layer 12, a second semiconductor chip 19, a solder ball bump 17, an underfill layer 20, and a second packaging material layer 21.

The first packaging material layer 15 includes a first surface and a second surface opposite to the first surface, and the first packaging material layer 15 is packaged on a periphery of the first semiconductor chip 14.

The metal connecting pillar 13 is disposed in the first packaging material layer 15 and penetrates the first packaging material layer 15 vertically.

The first rewiring layer 16 is disposed on a first surface of the first packaging material layer 15, and electrically connected to the first semiconductor chip 14 and the metal connecting pillar 13.

The second rewiring layer 12 is disposed on a second surface of the first packaging material 15, and electrically connected to the metal connecting pillar 13, to realize electrical connection between the first rewiring layer 16 and the second rewiring layer 12 through the metal connecting pillar 13. The first semiconductor chip 14 is bonded to the second rewiring layer 12;

The second semiconductor chip 19 is disposed on a surface of the second rewiring layer 12 away from the first semiconductor chip 14, and electrically connected to the second rewiring layer 12.

The solder ball bump 17 is disposed on a surface of the first rewiring layer 16 away from the first semiconductor chip 14, and electrically connected to the first rewiring layer 16.

The underfill layer 20 is disposed between the second semiconductor chip 19 and the second rewiring layer 12.

The second packaging material layer 21 packages the second semiconductor chip 19 on a periphery of the second semiconductor chip 19.

As an example, the first semiconductor chip 14 is a bare chip or a packaged chip, and the second semiconductor chip 19 is a bare chip or a packaged chip. As shown in FIG. 17, the first semiconductor chip 14 is a bare chip, and the second semiconductor chip 19 is a packaged chip. Further, the bare chip includes a contact pad 141, a dielectric layer 142 is formed on the bare chip, and a metal pillar 143 is formed in the dielectric layer 142 and penetrates the dielectric layer 142. One end of the metal pillar 143 is connected to the contact pad 141, and the other end of the metal pillar 143 is connected to the first rewiring layer 16. The packaged chip includes contact pads 191. Solder connection structures are formed on the packaged chip. Each of the solder connection structures includes a metal pillar 192 and a solder ball 193. One end of the metal pillar 192 is connected to the contact pad 191, the other end is connected to the solder ball 193, and the solder ball 193 is connected to the second rewiring layer 12.

As an example, the first rewiring layer 16 includes a first wiring dielectric layer 161 and a first metal wiring layer 162 located in the first wiring dielectric layer 161, and the second rewiring layer 12 includes a second wiring dielectric layer 121 and a second metal wiring layer 122 located in the second wiring dielectric layer 121. The material of the first wiring dielectric layer 161 and the second wiring dielectric layer 121 includes one or more of epoxy resin, silicone rubber, PI, PBO, BCB, silicon oxide, phosphorosilicate glass, and fluorine-containing glass. The material of the first metal wiring layer 162 and the second metal wiring layer 122 includes one or more of copper, aluminum, nickel, gold, silver, and titanium.

As an example, the first packaging material layer 15 includes one or more of a polyimide layer, a silicone rubber layer, and an epoxy resin layer. The second packaging material layer 21 includes one or more of a polyimide layer, a silicone rubber layer, and an epoxy resin layer. The underfill layer 20 includes an epoxy resin layer.

As an example, the material of the solder ball bumps 17 includes one or more of copper, aluminum, nickel, gold, silver, and titanium.

In summary, the present disclosure provides a three-dimensional stacked fan-out packaging structure and a method making the same. The formed three-dimensional stacked fan-out packaging structure can package two layers of fan-out wafers in the three-dimensional direction (i.e., the thickness direction). A single package formed after die cutting has two layers of chips in the three-dimensional direction. The electrical signals of all chips in a single package can be controlled by arranging a first rewiring layer, a metal connecting post, and the second rewiring layer, so that more chips can be packaged in a single package, the integration of the fan-out wafer level package is improved, and the package volume may shrink. Furthermore, packaging multiple chips in the same package can effectively improve the performance of a single chip. Finally, the method also makes it possible to package more than three layers of fan-out wafers in a single package. Therefore, the present disclosure effectively overcomes various shortcomings in the existing technology and has high industrial utilization value.

The above-mentioned embodiments are just used for exemplarily describing the principle and effects of the present disclosure instead of limiting the present disclosure. Those skilled in the art can make modifications or changes to the above-mentioned embodiments without going against the spirit and the range of the present disclosure. Therefore, all equivalent modifications or changes made by those who have common knowledge in the art without departing from the spirit and technical concept disclosed by the present disclosure shall be still covered by the claims of the present disclosure.

We claim:

1. A method for making a three-dimensional stacked fan-out packaging structure, comprising:
providing a first supporting substrate;
disposing a separation layer on the first supporting substrate;
forming a second rewiring layer on the separation layer;

forming a metal connection pillar on the second rewiring layer, wherein the metal connection pillar is electrically connected to the second rewiring layer;
providing a first semiconductor chip and bonding the first semiconductor chip to the second rewiring layer;
forming a first packaging material layer on a surface of the second rewiring layer, wherein the first packaging material layer fills a gap between the first semiconductor chip and the metal connecting pillar and packages the first semiconductor chip and the metal connecting pillar, wherein the first packaging material layer includes a first surface and a second surface opposite to the first surface, wherein the second surface of the first packaging material layer is in contact with the second rewiring layer, and the first surface of the first packaging material layer exposes the metal connecting pillar;
forming a first rewiring layer on the first surface of the first packaging material layer, wherein the first rewiring layer is electrically connected to the first semiconductor chip and the metal connecting pillar;
forming a solder bump on a surface of the first rewiring layer away from the first semiconductor chip, wherein the solder bump is electrically connected to the first rewiring layer;
providing a second supporting substrate and bonding the second supporting substrate to the first rewiring layer;
removing the first supporting substrate and the separation layer to expose the second rewiring layer;
providing a second semiconductor chip and electrically connecting the second semiconductor chip to the second rewiring layer;
forming an underfill layer between the second semiconductor chip and the second rewiring layer;
forming a second packaging material layer on a periphery area of the second semiconductor chip; and
removing the second supporting substrate.

2. The method for making the three-dimensional stacked fan-out packaging structure according to claim 1,
wherein the first supporting substrate comprises one of a glass substrate, a metal substrate, a semiconductor substrate, a polymer substrate, and a ceramic substrate;
wherein the second supporting substrate comprises one of a glass substrate, a metal substrate, a semiconductor substrate, a polymer substrate, and a ceramic substrate; and
wherein the separation layer is a polymer layer or an adhesive layer, wherein the separation layer is coated on the surface of the first supporting substrate by a spin coating process, then cured and molded by an ultraviolet curing or thermal curing process.

3. The method for making the three-dimensional stacked fan-out packaging structure according to claim 1,
wherein the first rewiring layer comprises a first wiring dielectric layer and a first metal wiring layer disposed in the first wiring dielectric layer, and wherein the second rewiring layer comprises a second wiring dielectric layer and a second metal wiring layer disposed in the second wiring dielectric layer;
wherein a material of the first wiring dielectric layer and a material of the second wiring dielectric layer each comprises one or more of epoxy resin, silicone rubber, polyimide (PI), polybenzoxazole (PBO), benzocyclobutene (BCB), silicon oxide, phosphorosilicate glass, and fluorine-containing glass; and
wherein a material of the first metal wiring layer and a material of the second metal wiring layer comprises one or more of copper, aluminum, nickel, gold, silver, and titanium.

4. The method for making the three-dimensional stacked fan-out packaging structure according to claim 3, wherein the forming of the first rewiring layer and the second rewiring layer comprises:
forming a dielectric layer using a chemical vapor deposition process or a physical vapor deposition process, and etching the dielectric layer to form the wiring dielectric layer, and
forming a metal layer on a surface of the wiring dielectric layer using a chemical vapor deposition process, a physical vapor deposition process, a sputtering process, an electroplating process, or an electroless plating process, and etching the metal layer to form a metal wiring layer, wherein the metal connection pillar is electrically connected to the metal wiring layer.

5. The method for making the three-dimensional stacked fan-out packaging structure according to claim 1, wherein the first semiconductor chip is a first bare chip which is unpackaged or a first packaged chip, and the second semiconductor chip is a second bare chip which is unpackaged or a second packaged chip.

6. The method for making the three-dimensional stacked fan-out packaging structure according to claim 1, wherein the first semiconductor chip is a first bare chip, and the second semiconductor chip is a second bare chip, the first bare chip and the second bare chip each comprises a contact pad, a dielectric layer formed on the contact pad, and a metal pillar formed in the dielectric layer and penetrating the dielectric layer, wherein one end of the metal pillar is connected to the contact pad, and another end of the metal pillar is connected to the first rewiring layer.

7. The method for making the three-dimensional stacked fan-out packaging structure according to claim 1, wherein the first semiconductor chip is a first bare chip, and the second semiconductor chip is a second packaged chip, the first bare chip comprises a contact pad, a dielectric layer formed on the contact pad, and a metal pillar formed in the dielectric layer and penetrating the dielectric layer, wherein one end of the metal pillar is connected to the contact pad, and another end of the metal pillar is connected to the first rewiring layer, and the second packaged chip comprises a contact pad, wherein a solder connection structure is formed on the first packaged chip, and the solder connection structure comprises a metal pillar and a solder ball, wherein one end of the metal pillar is connected to the contact pad, another end of the metal pillar is connected to the solder ball, and the solder ball is connected to the first rewiring layer.

8. The method for making the three-dimensional stacked fan-out packaging structure according to claim 1, wherein the first semiconductor chip is a first packaged chip and the second semiconductor chip is a second bare chip, wherein the first packaged chip comprises a contact pad, wherein a solder connection structure is formed on the first packaged chip, and the solder connection structure comprises a metal pillar and a solder ball, wherein one end of the metal pillar is connected to the contact pad, another end of the metal pillar is connected to the solder ball, and the solder ball is connected to the first rewiring layer, and the second bare chip comprises a contact pad, a dielectric layer formed on the contact pad, and a metal pillar formed in the dielectric layer and penetrating the dielectric layer, wherein one end of the metal pillar is connected to the contact pad, and another end of the metal pillar is connected to the second rewiring layer.

9. The method for making the three-dimensional stacked fan-out packaging structure according to claim 1, wherein
the first semiconductor chip is a first packaged chip and the second semiconductor chip is a second packaged chip, the first packaged chip and the second packaged chip each comprises a contact pad, wherein a solder connection structure is formed on the second packaged chip, and the solder connection structure comprises a metal pillar and a solder ball, wherein one end of the metal pillar is connected to the contact pad, another end of the metal pillar is connected to the solder ball, and the solder ball is connected to the second rewiring layer.

10. A three-dimensional stacked fan-out packaging structure, comprising:
a first semiconductor chip;
a first packaging material layer, comprising a first surface and a second surface opposite to the first surface, wherein the first packaging material layer is disposed in a periphery area of the first semiconductor chip;
a metal connecting pillar, disposed penetrating through the first packaging material layer;
a first rewiring layer, disposed on the first surface of the first packaging material layer, and electrically connected to the first semiconductor chip and the metal connecting pillar;
a second rewiring layer, disposed on the second surface of the first packaging material, and electrically connected to the metal connecting pillar, wherein the second rewiring layer electrically connects to the first rewiring layer through the metal connecting pillar, wherein the first semiconductor chip is bonded to the second rewiring layer;
a second semiconductor chip, disposed on a surface of the second rewiring layer away from the first semiconductor chip, and electrically connected to the second rewiring layer;
a solder ball bump, disposed on a surface of the first rewiring layer away from the first semiconductor chip, and electrically connected to the first rewiring layer;
an underfill layer, disposed between the second semiconductor chip and the second rewiring layer; and
a second packaging material layer, packaging the second semiconductor chip in a periphery area of the second semiconductor chip.

11. The three-dimensional stacked fan-out packaging structure according to claim 10, wherein the first semiconductor chip is a first bare chip which is unpackaged or a first packaged chip, and the second semiconductor chip is a second bare chip which is unpackaged or a second packaged chip.

12. The three-dimensional stacked fan-out packaging structure according to claim 10, wherein
the first semiconductor chip is a first bare chip, and the second semiconductor chip is a second bare chip, the first bare chip and the second bare chip each comprises a contact pad, a dielectric layer formed on the contact pad, and a metal pillar formed in the dielectric layer and penetrating the dielectric layer, wherein one end of the metal pillar is connected to the contact pad, and another end of the metal pillar is connected to the first rewiring layer.

13. The three-dimensional stacked fan-out packaging structure according to claim 10, wherein
the first semiconductor chip is a first bare chip, and the second semiconductor chip is a second packaged chip, the first bare chip comprises a contact pad, a dielectric layer formed on the contact pad, and a metal pillar formed in the dielectric layer and penetrating the dielectric layer, wherein one end of the metal pillar is connected to the contact pad, and another end of the metal pillar is connected to the first rewiring layer, and the second packaged chip, the first packaged chip comprises a contact pad, wherein a solder connection structure is formed on the first packaged chip, and the solder connection structure comprises a metal pillar and a solder ball, wherein one end of the metal pillar is connected to the contact pad, another end of the metal pillar is connected to the solder ball, and the solder ball is connected to the first rewiring layer.

14. The three-dimensional stacked fan-out packaging structure according to claim 10, wherein
the first semiconductor chip is a first packaged chip and the second semiconductor chip is a second bare chip, wherein the first packaged chip comprises a contact pad, wherein a solder connection structure is formed on the first packaged chip, and the solder connection structure comprises a metal pillar and a solder ball, wherein one end of the metal pillar is connected to the contact pad, another end of the metal pillar is connected to the solder ball, and the solder ball is connected to the first rewiring layer, and the second bare chip comprises a contact pad, a dielectric layer formed on the contact pad, and a metal pillar formed in the dielectric layer and penetrating the dielectric layer, wherein one end of the metal pillar is connected to the contact pad, and another end of the metal pillar is connected to the second rewiring layer.

15. The three-dimensional stacked fan-out packaging structure according to claim 10, wherein
the first semiconductor chip is a first packaged chip and the second semiconductor chip is a second packaged chip, the first packaged chip and the second packaged chip each comprises a contact pad, wherein a solder connection structure is formed on the second packaged chip, and the solder connection structure comprises a metal pillar and a solder ball, wherein one end of the metal pillar is connected to the contact pad, another end of the metal pillar is connected to the solder ball, and the solder ball is connected to the second rewiring layer.

16. The three-dimensional stacked fan-out packaging structure according to claim 10,
wherein the first rewiring layer includes a first wiring dielectric layer and a first metal wiring layer disposed in the first wiring dielectric layer, and wherein the second rewiring layer includes a second wiring dielectric layer and a second metal wiring layer disposed in the second wiring dielectric layer;
wherein a material of the first wiring dielectric layer and a material of the second wiring dielectric layer each comprises one or more of epoxy resin, silicone rubber, polyimide (PI), polybenzoxazole (PBO), benzocyclobutene (BCB), silicon oxide, phosphorosilicate glass, and fluorine-containing glass; and
wherein a material of the first metal wiring layer and a material of the second metal wiring layer each comprises one or more of copper, aluminum, nickel, gold, silver, and titanium.

17. The three-dimensional stacked fan-out packaging structure according to claim 10,
- wherein the first packaging material layer comprises one or more of a polyimide layer, a silicone rubber layer, and an epoxy resin layer;
- wherein the second packaging material layer comprises one or more of a polyimide layer, a silicone rubber layer, and an epoxy resin layer; and
- wherein the underfill layer comprises an epoxy resin layer.

18. The three-dimensional stacked fan-out packaging structure according to claim 10, wherein a material of the solder ball bump comprises one or more of copper, aluminum, nickel, gold, silver, and titanium.

* * * * *